United States Patent
Arai

(10) Patent No.: US 8,582,244 B2
(45) Date of Patent: Nov. 12, 2013

(54) FLEXURE AND HEAD SUSPENSION WITH FLEXURE

(75) Inventor: Hajime Arai, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/401,189

(22) Filed: Feb. 21, 2012

(65) Prior Publication Data

US 2012/0224281 A1  Sep. 6, 2012

(30) Foreign Application Priority Data

Mar. 3, 2011  (JP) .................................. 2011-046364

(51) Int. Cl.
*G11B 5/48*  (2006.01)
(52) U.S. Cl.
USPC ..................................... 360/245.9; 360/345.8
(58) Field of Classification Search
USPC ........................................... 360/245.8–245.9
See application file for complete search history.

(56) References Cited

U.S. PATENT DOCUMENTS

| 8,395,866 B1 * | 3/2013 | Schreiber et al. | 360/245.9 |
| 2010/0296195 A1 * | 11/2010 | Kikuchi et al. | 360/245 |

FOREIGN PATENT DOCUMENTS

| JP | 2003-031915 | 1/2003 |
| JP | 2007-287280 | 11/2007 |
| JP | 2010272178 A * | 12/2010 |

* cited by examiner

*Primary Examiner* — Will J Kilmowicz
(74) *Attorney, Agent, or Firm* — Jordan and Hamburg LLP

(57) ABSTRACT

A flexure has a metal base plate, an insulating layer formed on the metal base plate, a wiring pattern formed on the insulating layer, a read-write head connected to a first end of the wiring pattern, and terminals for external connection that are adjacent to each other and are connected to a second end of the wiring pattern. The flexure includes a hole formed through the insulating layer in the vicinity of respective one of the adjacent terminals and an exposed part being a part of the metal base plate that is exposed through the hole to the terminals. A distance between the respective one of the adjacent terminals and the exposed part exposed through the hole in the vicinity thereof is shorter than a distance between the adjacent terminals.

10 Claims, 7 Drawing Sheets

FLEXURE AND HEAD SUSPENSION WITH FLEXURE

BACKGROUND OF THE INVENTION

1. Field of the Invention

The present invention relates to a flexure that supports a read-write head and to a head suspension with the flexure, the head suspension with the flexure and read-write head being used to write and read data to and from a magnetic disk in a magnetic disk drive or hard disk drive.

2. Description of Related Art

In a magnetic disk drive or hard disk drive, the read-write head supported with a head suspension slightly floats from a surface of a magnetic disk driven at high speed and writes/reads data to/from the magnetic disk. Examples of the head suspension are disclosed in, for example, Japanese Unexamined Patent Application Publications No. 2003-031915 and No. 2007-287280 in which the head suspension supports the read-write head with a flexure.

The flexure includes a metal base plate, an insulating layer formed on the metal base plate, and a wiring pattern formed on the insulating layer. A first end of the wiring pattern is connected to the read-write head and a second end thereof is connected to a plurality of terminals for external connection. The terminals are connected to terminals of a circuit board of the magnetic disk drive, to establish electrical connection between the read-write head and the circuit board.

Recent magnetic disk drives or hard disk drives are required to reduce power consumption and improve operating speed. For this, it is very important to correctly measure and evaluate electrical characteristics of the flexure.

To measure and evaluate the electrical characteristics of a flexure, TDR (time domain reflectometry) is used for measuring a characteristic impedance of the flexure, or S-parameters are used for testing a transmission loss of the flexure.

To correctly carry out the electrical characteristics evaluation, a measuring device used for the evaluation must correctly be calibrated at an impedance of 50Ω and the calibrated state must be maintained.

In addition, the measuring device, which is provided with a signal probe and a ground probe, must secure a fixed probe distance between the signal probe and the ground probe. The probe distance must be within about 350 micrometers (μm) when measuring GHz-order high frequencies transmitted through the flexure.

Due to such a short probe distance, the flexure must secure a contact point for the ground probe in the vicinity of a terminal serving as a contact point for the signal probe.

Flexures according to related arts have no consideration on the contact point for the ground probe, and therefore, an insulating layer of a flexure sampled for an electrical characteristics evaluation must be removed in the vicinity of a terminal of the flexure, to expose a metal base plate of the flexure for a contact point of the ground probe.

The removal of the insulating layer of the flexure deteriorates workability of the electrical characteristics evaluation and roughens the surface of the contact point for the ground probe to shorten the service life of the ground probe of the measuring device that is expensive.

SUMMARY OF THE INVENTION

An object of the present invention is to provide a flexure that allows electrical characteristics thereof to be correctly measured without removing an insulating layer around a terminal of the flexure, as well as a head suspension with such a flexure.

In order to accomplish the objects, an aspect of the present invention provides a flexure having a metal base plate, an insulating layer formed on the metal base plate, a wiring pattern formed on the insulating layer, a read-write head connected to a first end of the wiring pattern, and at least a pair of terminals for external connection that are adjacent to each other and are connected to a second end of the wiring pattern. The flexure includes a hole formed through the insulating layer in the vicinity of respective one of the adjacent terminals and an exposed part being a part of the metal base plate that is exposed through the hole to the terminals. A distance between the respective one of the adjacent terminals and the exposed part exposed through the hole in the vicinity thereof is shorter than a distance between the adjacent terminals.

According to this aspect of the present invention, the exposed part of the metal base plate exposed through the hole of the insulating layer is present in the vicinity of respective one of the terminals, to allow electrical characteristics of the flexure to be correctly measured without removing the insulating layer and the like around the terminals.

DETAILED DESCRIPTION OF EMBODIMENTS

Embodiments of the present invention will be explained. Each embodiment provides a flexure that allows electrical characteristics thereof to be correctly measured without removing an insulating layer in a terminal area of the flexure.

The flexure includes terminals that are present adjacent to each other. A hole is formed through the insulating layer in the vicinity of respective one of the adjacent terminals and an exposed part of a metal base plate of the flexure that is exposed through the hole to the terminals. A distance between the respective one of the adjacent terminals and the hole in the vicinity thereof is shorter than a distance between the adjacent terminals.

Preferably, the distance is equal to or shorter than 250 μm.

In the preferred embodiment, the flexure has plural pairs of terminals and holes for exposed parts in the vicinities of the terminals, respectively. Alternatively, one hole for one exposed part may be formed with respect to each pair of terminals.

Hereinafter, each embodiment of the present invention will be explained with reference to the drawings.

Figure 1:
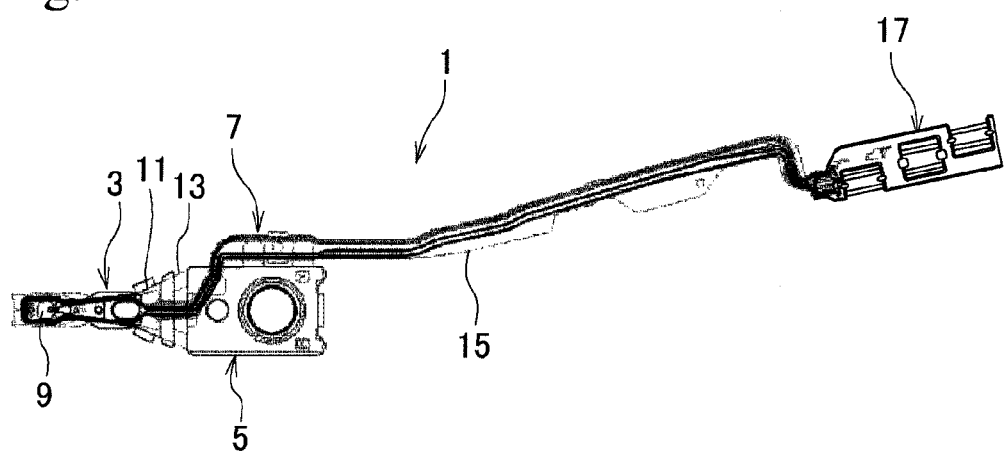
FIG. 1 is a plan view illustrating a head suspension with a flexure according to a first embodiment of the present invention.

FIG. 1 is a plan view illustrating a head suspension with a flexure according to a first embodiment of the present invention.

The head suspension 1 has a load beam 3, a base plate 5, and the flexure 7.

The load beam 3 applies load onto a slider 9 that supports a read-write head. The load beam 3 has a rigid part 11 and a resilient part 13. The rigid part 11 is made of, for example, stainless steel having a thickness of about, for example, 100 μm.

The resilient part 13 is separate from the rigid part 11 and is made of, for example, a resilient thin stainless steel rolled plate. The resilient part 13 has a precision low spring constant that is lower than that of the rigid part 11. The resilient part 13 has a thickness of about, for example, 40 μm. A first end of the resilient part 13 is fixed to a rear end of the rigid part 11 and a second end thereof is connected to a front end of the base plate 5 by, for example, laser welding.

The base plate 5 supports the resilient part 13 that supports the rigid part 11. The base plate 5 is attached to an arm of a carriage (not illustrated) that drives the base plate 5 around a rotation axis.

The flexure 7 extends along the load beam 3 and is fixed to the load beam 3 by, for example, laser welding. A front end of the flexure 7 supports the slider 9 and a base end thereof forms a tail 15 extending from the base plate 5.

An end of the tail 15 forms a terminal area 17 having terminals 27a to 27f. The terminals 27a to 27f are connected to circuit board terminals of a circuit board of a hard disk drive (not illustrated) by, for example, ultrasonic bonding or soldering, to establish electrical connection between the slider 9 and the circuit board.

Figure 2A:
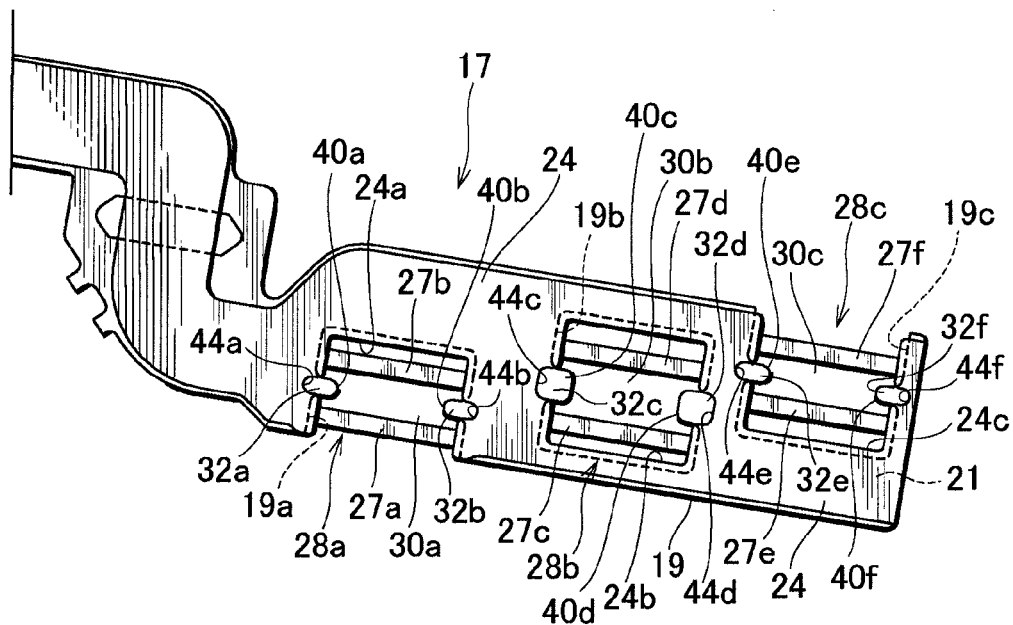
FIG. 2A is a plan view illustrating a terminal area of the flexure of FIG. 1.
Figure 2B:
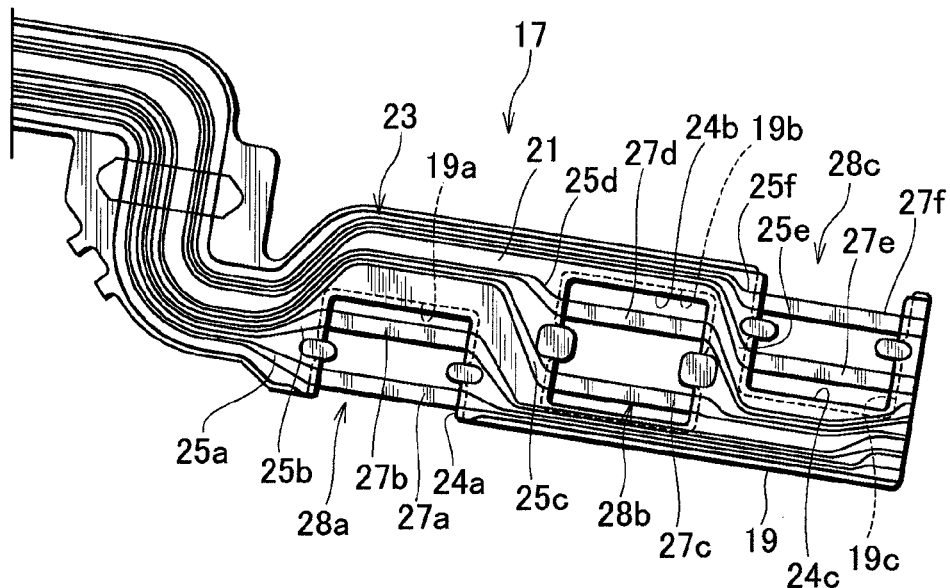
FIG. 2B is a plan view similar to FIG. 2A, transparently illustrating a wiring pattern on the flexure.
Figure 3:
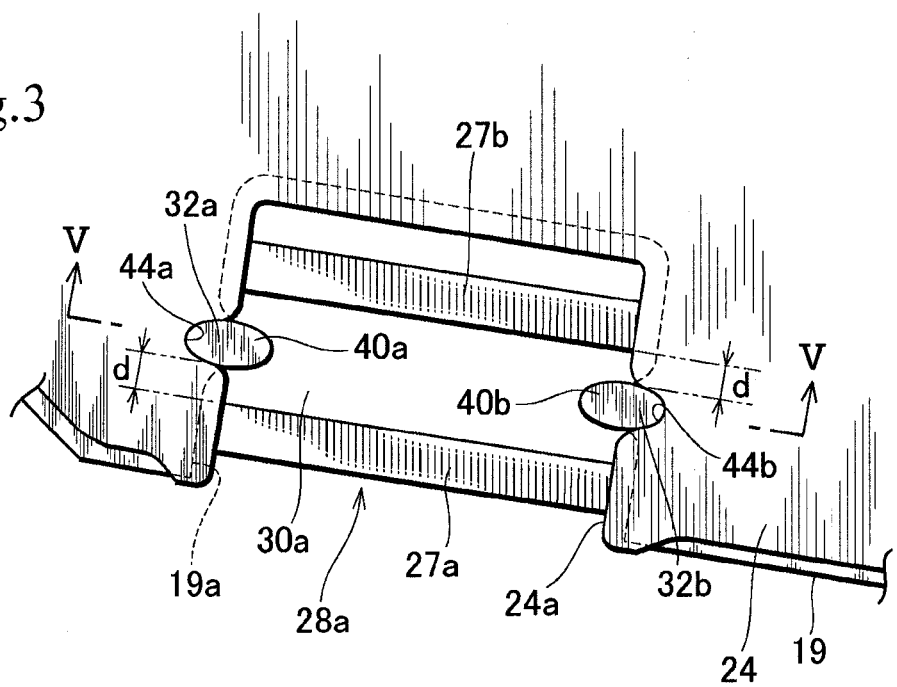
FIG. 3 is a plan view illustrating part of FIG. 2A.
Figure 4:
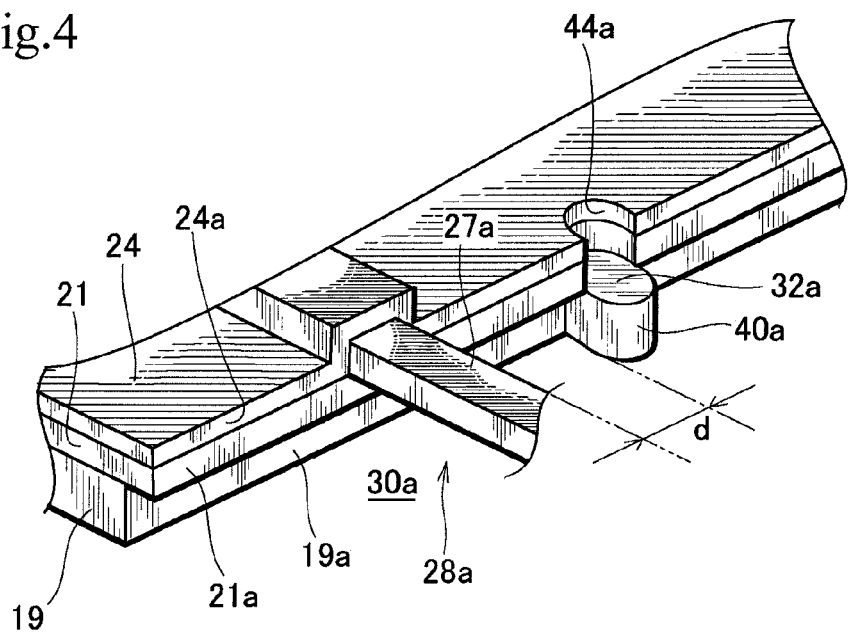
FIG. 4 is a perspective view illustrating part of FIG. 3.
Figure 5:
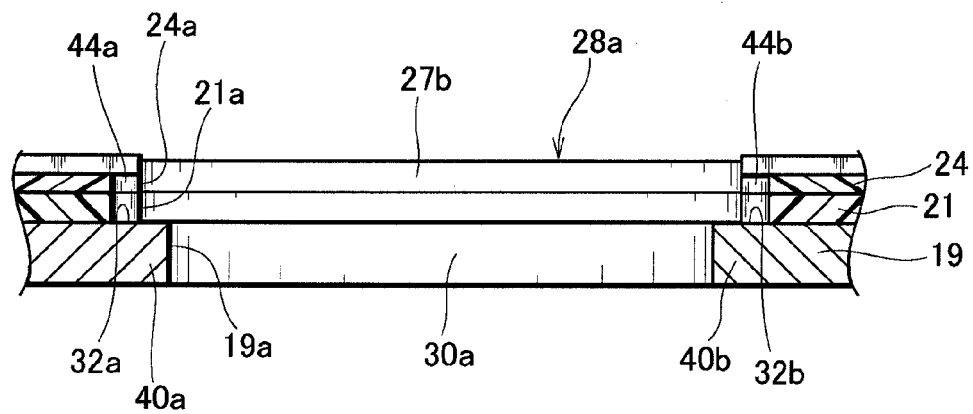
FIG. 5 is a sectional view taken along a line V-V of FIG. 3.

FIG. 2A is a plan view illustrating the terminal area 17 of the flexure 7, FIG. 2B is a plan view similar to FIG. 2A, transparently illustrating a wiring pattern 23 on the flexure 7, FIG. 3 is a plan view illustrating part of FIG. 2A, FIG. 4 is a perspective view illustrating part of FIG. 3, and FIG. 5 is a sectional view taken along a line V-V of FIG. 3.

As illustrated in FIGS. 1 to 5, the flexure 7 includes a metal base plate 19, a base insulating layer 21 formed on the metal base plate 19, and the wiring pattern 23 formed on the base insulating layer 21.

The metal base plate 19 is made of a resilient conductive thin plate such as a resilient thin stainless steel rolled plate (SST) having a thickness in the range of about 12 to 20 μm in a layer direction.

The base insulating layer 21 is made of flexible insulating resin such as polyimide having a thickness in the range of about 5 to 15 μm in the layer direction.

The wiring pattern 23 is made of conductive metal such as copper having a thickness in the range of about 8 to 15 μm in the layer direction. The wiring pattern 23 is covered with a cover insulating layer 24 that is on the base insulating layer 21.

The cover insulating layer 24 is made of flexible insulating resin such as polyimide having a thickness in the range of about 1 to 5 μm. The cover insulating layer 24 may be omitted.

The wiring pattern 23 functions as read/write wiring for transmitting read/write signals and heater and sensor wiring for finely adjusting the slider 9. The wiring pattern 23 includes a plurality of patterned traces 25a to 25f.

The patterned traces 25a to 25f extend from the front end toward the base end of the flexure 7. Front ends of the patterned traces 25a to 25f are connected to the slider 9 and base ends thereof are connected to the terminals 27a to 27f in the terminal area 17, respectively.

The terminals 27a to 27f are to be connected to the circuit board terminals. In addition, the terminals 27a to 27f serve as contact points for a signal probe 48 of a measuring device 46 when evaluating electrical characteristics of the flexure 7.

The terminals 27a and 27b form a terminal set (pair) 28a, the terminals 27c and 27d form a terminal set (pair) 28b, and the terminals 27e and 27f form a terminal set (pair) 28c. The terminal sets 28a to 28c are shifted from one another in an extending direction of the flexure 7.

The terminal sets 28a to 28c have substantially the same configuration, and therefore, the terminal set 28a will be explained and the terminal sets 28b and 28c will be explained only about their differences from the terminal set 28a. Parts of the terminal sets 28b and 28c that correspond to parts of the terminal set 28a are represented with like reference marks, or like reference marks plus different alphabetical letters.

The terminal set 28a includes an opening 30a, a pair of the terminals 27a and 27b, and a pair of exposed parts 32a and 32b.

The opening 30a is formed by removing or etching, in a thickness direction, the metal base plate 19, base insulating layer 21, and cover insulating layer 24 of the flexure 7.

The opening 30a is open to an edge of the flexure 7 and substantially has a rectangular plan shape. An opening 30b of the terminal set 28b is positioned at a widthwise intermediate part of the flexure 7 and has a closed rectangular plan shape.

The opening 30a is defined with an opening edge 21a of the base insulating layer 21, an opening edge 24a of the cover insulating layer 24, and an opening edge 19a of the metal base plate 19. The opening edges 21a and 24a substantially have the same shape and the opening edge 19a is larger than the opening edges 21a and 24a.

Namely, the base insulating layer 21 and cover insulating layer 24 protrude from the opening edge 19a of the metal base plate 19 into the opening 30a. On each side of a widthwise intermediate part of the opening 30a, the terminals 27a and 27b are present.

The terminals 27a and 27b are flying leads and are part of the patterned traces 25a and 25b that pass over the opening 30a. The terminals 27a and 27b are wider than the remaining part of the patterned traces 25a and 25b.

The terminals 27a and 27b extend in the extending direction of the flexure 7 and are arranged in parallel with each other and adjacent to each other with a predetermined space secured between them. The exposed parts 32a and 32b are positioned between the terminals 27a and 27b and are exposed through holes 44a and 44b in the thickness direction to the terminals 27a and 27b.

The holes 44a and 44b are formed by, for example, etching off the base insulating layer 21 and cover insulating layer 24. The holes 44a and 44b are closer to the respective terminals 27a and 27b than the adjacent terminal. Namely, the holes 44a and 44b are in the vicinities of the respective one of the adjacent terminals 27a and 27b. Each distance between the respective terminals 27a and 27b and the holes 44a and 44b in the vicinities thereof is shorter than a distance between the adjacent terminals 27a and 27b.

According to the embodiment, the holes 44a and 44b are positioned substantially at a widthwise center of the opening 30a and face the opening edges 21a and 24a, and the distance between the hole 44a (44b) and the terminal 27a (27b) is equal to or shorter than 250 μm.

Plan shapes of the holes 44a and 44b are symmetrical with respect to each other and each are semicircular. The holes 44a and 44b are recessed from the opening edges 21a and 24a in a radial direction with respect to the center of the opening 30a, according to the embodiment, in the extending direction of the flexure 7. In the terminal set 28b, holes 44c and 44d each substantially have a rectangular plan shape.

The exposed parts 32a and 32b serve as contact points for a ground probe 50 of the measuring device 46. The exposed parts 32a and 32b are made from the metal base plate 19 exposed through the holes 44a and 44b.

Because of the positions of the holes 44a and 44b, the exposed parts 32a and 32b are closer to the respective adjacent terminals 27a and 27b than other adjacent terminal so that the exposed part is in the vicinity of the respective one of the adjacent terminals 27a and 27b. As a result, the exposed parts 32a and 32b secure a probe distance with respect to the terminals 27a and 27b, to realize a measurement of GHz-order high frequencies.

More precisely, the distance "d" between the exposed part 32a (32b) and the terminal 27a (27b) is equal to or shorter than 250 μm according to the positions of the hole 44a (44b). The distance "d" may properly be set according to a probe distance between the signal probe 48 and ground probe 50 of the measuring device 46.

A plan shape of each of the exposed parts 32a and 32b is substantially semicircular according to the shape of the holes 44a and 44b. In the terminal set 28b, the exposed parts 32c and 32d each substantially have a rectangular plan shape according to the rectangular shape of the holes 44c and 44d.

The exposed parts 32a and 32b integrally have projections 40a and 40b, respectively. The projections 40a and 40b project from the exposed parts 32a and 32b in the extending direction of the flexure 7. The projections 40a and 40b expand the areas of the exposed parts 32a and 32b.

Front ends of the projections 40a and 40b inwardly project from the opening edges 21a and 24a of the opening 30a and are interposed between the terminals 27a and 27b. The projections 40a and 40b of the exposed parts 32a and 32b are separated away from the terminals 27a and 27b by the distance of 250 μm or shorter.

A plan shape of each front end of the projections 40a and 40b is substantially semicircular and a whole plan shape of each of the exposed parts 32a and 32b is substantially elliptic or oval. In the terminal set 28b, projections 40c and 40d of the exposed parts 32c and 32d each have a rectangular front end and a rectangular total shape. The plan shape of each exposed part is optional and may take any shape in addition to elliptic or rectangular.

Front ends of the projections 40a and 40b are spaced from each other in the extending direction of the flexure 7, to avoid contact or short circuit of the terminals 27a and 27b to a portion between the projections 40a and 40b even if the terminals 27a and 27b are displaced.

Instead of the two projections 40a and 40b, a single projection may be formed in the opening 30a between the terminals 27a and 27b. Also, it is possible to omit the projections 40a and 40b.

Figure 6A:
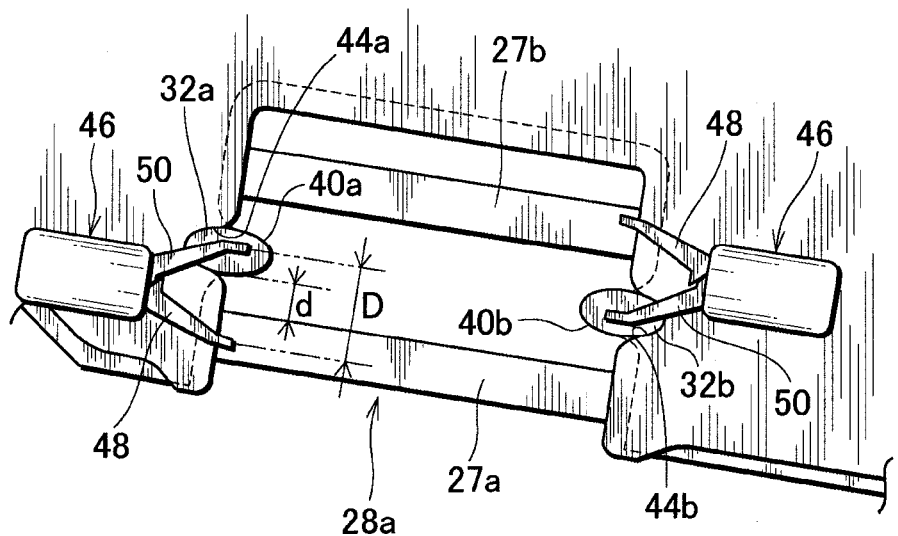
FIG. 6A is a schematic view illustrating the flexure of FIG. 3 with a measuring device.
Figure 6B:
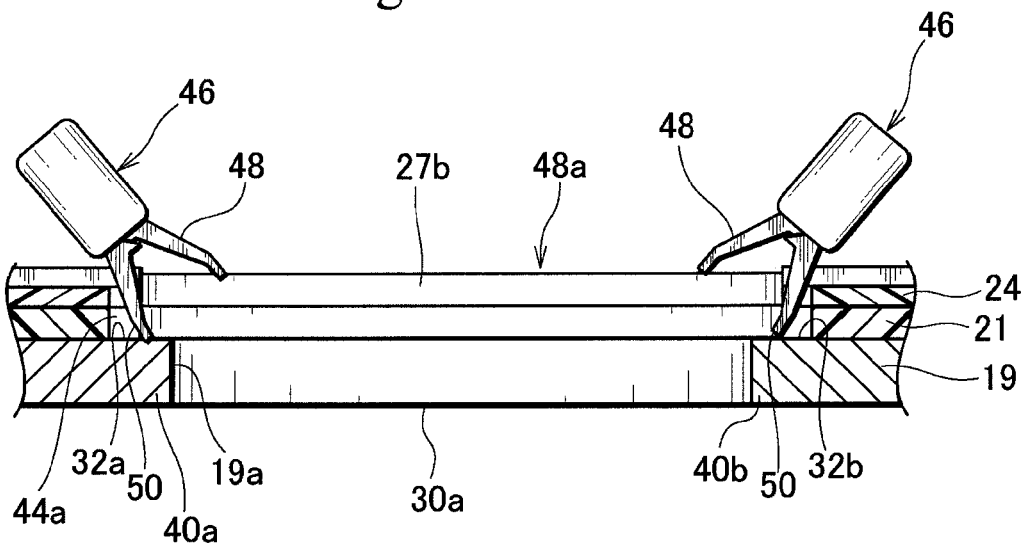
FIG. 6B is a sectional view illustrating the flexure of FIG. 5 with the measuring device.

FIGS. 6A and 6B correspond to FIGS. 3 and 5, respectively, and illustrate the flexure 7 and measuring device 46. In FIGS. 6A and 6B, the terminal set 28a involving the terminals 27a and 27b and exposed parts 32a and 32b is used to evaluate electrical characteristics of the flexure 7. The electrical characteristics evaluation may be a characteristic impedance evaluation with TDR (time domain reflectometry), a transmission loss evaluation with S-parameters, or the like.

The measuring device 46 used for the electrical characteristics evaluation includes the signal probe 48 and ground probe 50. A probe distance "D" between the probes 48 and 50 is fixed to, for example, about 350 μm.

The probe distance "D" must be narrow to measure high frequencies. The probe distance "D" of about 350 μm is able to measure GHz-order high frequencies.

The probe distance "D" may be made narrower than 350 μm, to increase measurable frequencies. In this case, the distance "d" between the terminal 27a (27b) and the exposed part 32a (32b) must be narrowed according to the probe distance "D". A minimum probe distance is properly determined according to the measuring device 46.

With the above-mentioned probe distance "D", the measuring device 46 is capable of measuring GHz-order high frequencies and can correctly be calibrated at an impedance of 50Ω and can maintain the calibrated state.

When conducting an electrical characteristics evaluation of the flexure 7, such as a characteristic impedance evaluation with TDR, the signal probe 48 of the measuring device 46 is brought into contact with the terminal 27a (27b) of the flexure 7 and the ground probe 50 thereof is brought into contact with the exposed part 32a (32b) in the vicinity of the terminal 27a (27b).

With this, the signal probe 48 becomes conductive to the terminal 27a (27b) and patterned trace 25a (25b) of the wiring pattern 23 of the flexure 7. At the same time, the ground probe 50 is grounded through the exposed part 32a (32b) to the metal base plate 19 of the flexure 7.

The distance "d" between the terminal 27a (27b) and the exposed part 32a (32b) is 250 μm or shorter according to the probe distance "D", and therefore, the signal probe 48 and ground probe 50 of the measuring device 46 are surely brought into contact with the terminal and exposed part, respectively.

The area of the exposed part 32a (32b) is expanded with the projection 40a (40b), and therefore, is surely brought into contact with the ground probe 50.

The concave hole 44a (44b) of the exposed part 32a (32b) surely positions the ground probe 50 with an engagement, so that the ground probe 50 surely comes in contact with the exposed part 32a (32b). As a result, the signal probe 48 is surely brought into contact with the terminal 27a (27b).

In this state, the electrical characteristics of the flexure 7 are correctly measured.

The exposed part 32a (32b) of the flexure 7 secures a contact point for the ground probe 50 without removing part of the base insulating layer 21 and the like in the vicinity of the terminal 27a (27b).

The distance "d" between the exposed part 32a (32b) and the terminal 27a (27b) of the flexure 7 is set to 250 μm or shorter according to the probe distance "D" of 350 μm to measure GHz-order high frequencies and correctly carry out electrical characteristics evaluations of the flexure 7.

The flexure 7 according to the embodiment allows other electrical measurements in addition to the measurement with TDR. For example, a differential signal frequency domain transmission measurement, time domain transmission characteristic measurement, and crosstalk characteristic measurement may be carried out on the flexure 7 with the use of S-parameters. In this case, the measuring device 46 is brought into contact with the front end of the flexure 7 where the slider 9 is present in addition to the terminal area 17 of the flexure 7.

More precisely, the signal probe 48 and ground probe 50 of the measuring device 46 are brought into contact with a terminal (not illustrated) at the front end of the flexure 7 and the metal base plate 19 in the vicinity of the terminal.

In other electrical characteristics measurements of the flexure 7, the measuring device 46 may be brought into contact with a front end part or an intermediate part of the flexure 7.

The First Embodiment Provides the Following Effects.

The flexure according to the first embodiment has the metal base plate 19, the base insulating layer 21 formed on the metal base plate 19, the wiring pattern 23 formed on the base insulating layer 21, the read-write slider 9 connected to the first end of the wiring pattern 23, and the terminals 27a to 27f that are arranged adjacent to each other and are connected to the second end of the wiring pattern 23. The flexure 7 includes the hole (44a to 44f) formed through the base insulating layer 21 in the vicinity of respective one of the terminals 27a to 27f and the exposed part (32a to 32f) that is exposed part of the metal base plate 19 through the hole (44a to 44f) to the terminals 27a to 27f. The distance between the respective one of the terminals 27a to 27f and the exposed part exposed through the hole in the vicinity thereof is shorter than the distance between the adjacent terminals 27a to 27f.

The exposed parts 32a to 32f of the flexure 7 each secure a contact point for the ground probe 50 of the measuring device 46 without removing the base insulating layer 21 and the like in the vicinities of the terminals 27a to 27f.

Due to the hole 44a to 44f, the exposed parts 32a to 32f of the flexure 7 are closer to the respective terminals 27a to 27f than adjacent terminals, to secure the narrow probe distance "D" that allows a measurement of GHz-order high frequencies.

The flexure 7, therefore, allows electrical characteristics thereof to be correctly measured without removing the base insulating layer 21 in the vicinities of the terminals 27a to 27f. This improves measuring workability of the electrical characteristics of the flexure 7 and elongates the service life of the measuring device 46.

Since the base insulating layer 21 and the like are not removed for an electrical characteristics measurement, the flexure 7 sampled for the measurement can be shipped as a product.

The distance "d" between respective one of the exposed parts 32a to 32f and a corresponding one of the terminals 27a to 27f of the flexure 7 is set to 250 µm or shorter according to the probe distance "D" that allows a measurement of GHz-order high frequencies.

In the flexure 7, each of the exposed parts 32a to 32f is arranged between adjacent ones of the terminals 27a to 27f, so that the exposed part is present in the vicinity of the adjacent terminals to realize the narrow probe distance "D".

The flexure 7 has the openings 30a to 30c formed through the metal base plate 19 and base insulating layer 21. Passing over the openings 30a to 30c, the terminals 27a to 27f are formed as flying leads from the wiring pattern 23. This configuration allows the exposed parts 32a to 32f to be present within the openings 30a to 30c as well as the terminals 27a to 27f, to suppress accidentally contact with other members.

The holes 44a to 44f are recessed in the radial direction from the opening edges 21a and 24a of the openings 30a to 30c, to surely guide and position the ground probe 50 of the measuring device 46 onto the exposed parts 32a to 32f. This results in surely positioning the signal probe 48 of the measuring device 46 onto the terminals 27a to 27f.

The exposed parts 32a to 32f have the projections 40a to 40f, respectively, projecting into the openings 30a to 30c. The projections 40a to 40f expand the area of each contact point on the exposed parts 32a to 32f to surely receive the ground probe 50 of the measuring device 46.

The head suspension 1 having the flexure 7 according to the first embodiment includes the base plate 5 and the load beam 3 supported with the base plate 5. The load beam 3 supports the flexure 7. The head suspension 1 with the flexure 7 allows electrical characteristics of the flexure 7 to be correctly measured without removing the base insulating layer 21 around the terminals 27a to 27f.

This means that electrical characteristics of the head suspension 1 are measurable even after the head suspension 1 is manufactured as a product. With the electrical characteristics measured, the head suspension 1 becomes highly reliable.

Figure 7:
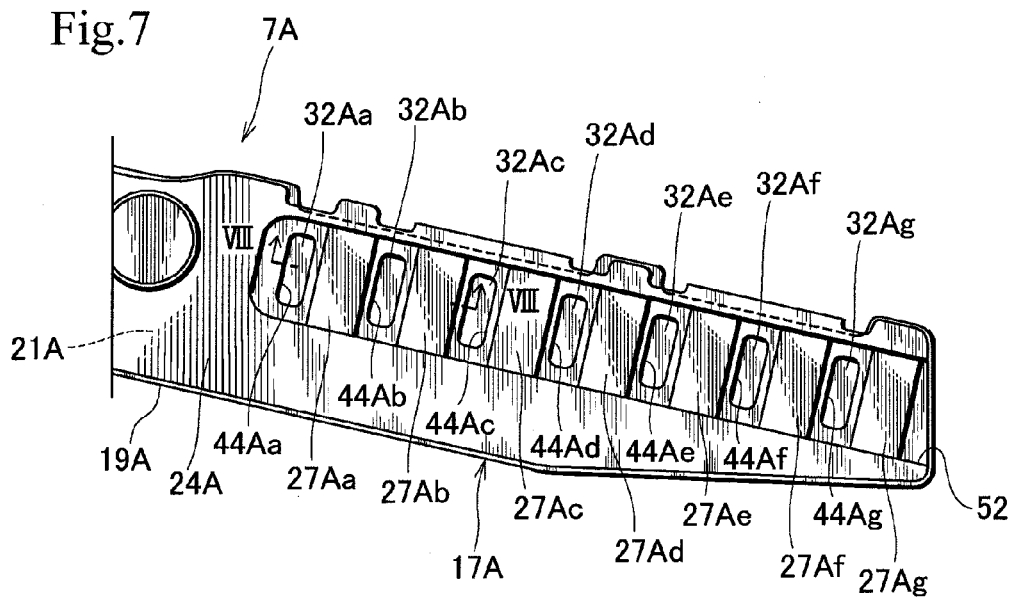
FIG. 7 is a plan view illustrating a terminal area of a flexure according to a second embodiment of the present invention.
Figure 8:
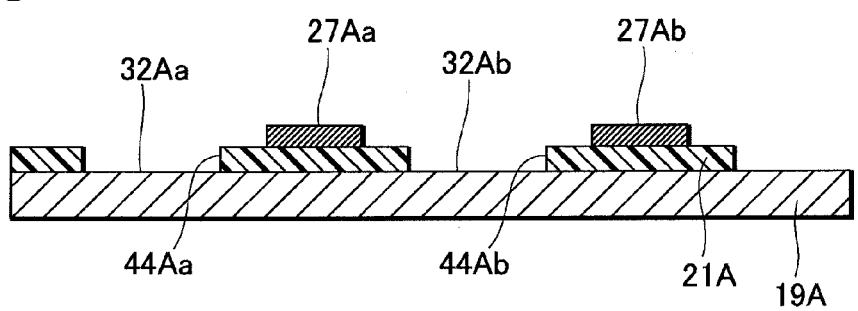
FIG. 8 is a sectional view taken along a line VIII-VIII of FIG. 7.

FIG. 7 is a plan view illustrating a terminal area of a flexure according to the second embodiment of the present invention and FIG. 8 is a sectional view taken along a line VIII-VIII of FIG. 7. The second embodiment is basically the same as the first embodiment, and therefore, like parts are represented with like reference marks, or like reference marks plus "A" to omit overlapping explanation.

According to the second embodiment, terminals 27Aa to 27Ag of the flexure 7A are non-flying leads, i.e., pads.

The terminals 27Aa to 27Ag each are a rectangular pad and are arranged orthogonal to an extending direction of the flexure 7A. The terminals 27Aa to 27Ag are arranged in parallel with one another with a predetermined gap between adjacent ones thereof.

Top faces of the terminals 27Aa to 27Ag are exposed to the outside through an opening 52 formed through a cover insulating layer 24A. The top faces of the terminals 27Aa to 27Ag are electrically connected through a conductive material such as a conductive adhesive to terminals of a circuit board of a magnetic disk drive.

Bottom faces of the terminals 27Aa to 27Ag are supported with a base insulating layer 21A and a metal base plate 19A. The base insulating layer 21A is continuous on and around the bottom faces of the terminals 27Aa to 27Ag.

The base insulating layer 21A and metal base plate 19A that support the terminals 27Aa to 27Ag have no openings or holes such as those of the flying-lead-type terminals in a range that affects the supporting strength of the terminals 27Aa to 27Ag, thereby surely supporting the terminals 27Aa to 27Ag.

Exposed parts 32Aa to 32Ag are formed closer to the respective terminals 27Aa to 27Ag than adjacent terminals.

The exposed parts 32Aa to 32Ag are in front of the terminals 27Aa to 27Ag, respectively, in the extending direction of the flexure 7A. Namely, the exposed parts 32Ab to 32Ag are arranged between corresponding pairs of the terminals 27Aa to 27Ag, respectively.

The exposed parts 32Aa to 32Ag expose the metal base plate 19A through holes 44Aa to 44Ag formed in the base insulating layer 21A. According to the holes 44Aa to 44Ag, the exposed parts 32Aa to 32Ag are substantially rectangular, are smaller than the terminals 27Aa to 27Ag, and are in parallel with the terminals 27Aa to 27Ag.

A distance between each of the exposed parts 32Aa to 32Ag and a corresponding one of the terminals 27Aa to 27Ag is equal to or shorter than 250 µm, like the first embodiment.

Accordingly, the second embodiment provides the same effect as the first embodiment.

The flexure 7A according to the second embodiment has the terminals 27Aa to 27Ag that are pads formed on the base insulating layer 21A that is continuous on and around the bottom faces of the terminals 27Aa to 27Ag. Accordingly, the terminals 27Aa to 27Ag have improved strength to surely receive the signal probe 48 of the measuring device 46 and stabilize a measurement of electrical characteristics of the flexure 7A.

The metal base plate 19A is continuous along the base insulating layer 21A, to further improve the strength of the terminals 27Aa to 27Ag and stably carry out a measurement of electrical characteristics of the flexure 7A.

Figure 9:
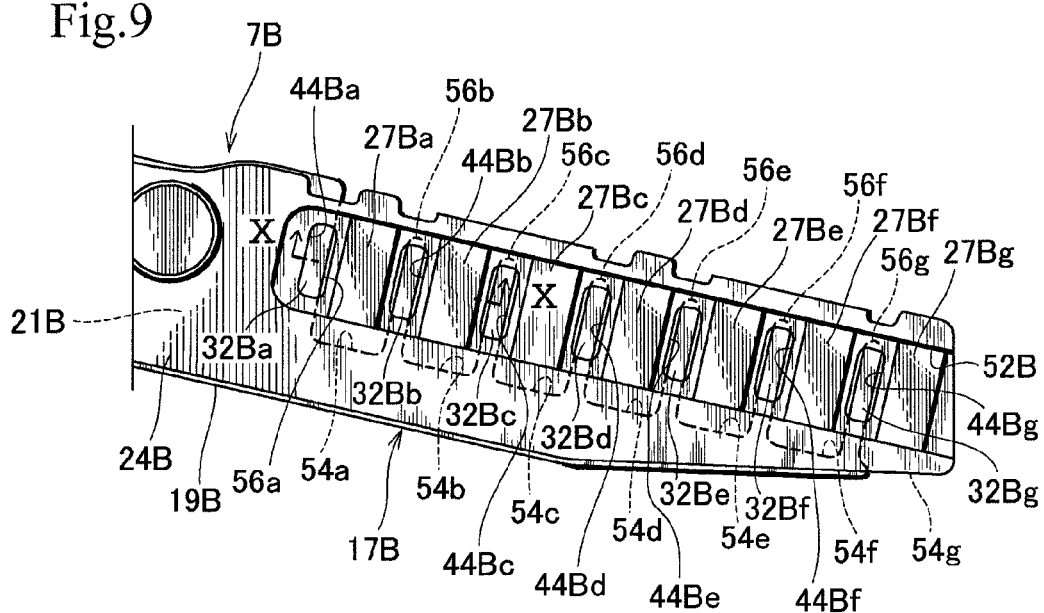
FIG. 9 is a plan view illustrating a terminal area of a flexure according to a third embodiment of the present invention.
Figure 10:
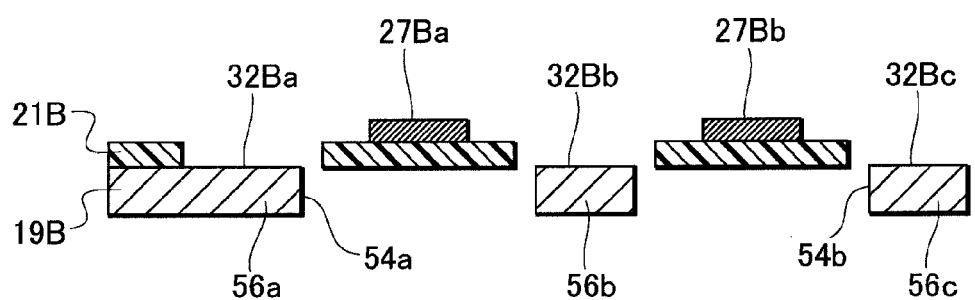
FIG. 10 is a sectional view taken along a line X-X of FIG. 9.

FIG. 9 is a plan view illustrating a terminal area of a flexure according to the third embodiment of the present invention and FIG. 10 is a sectional view taken along a line X-X of FIG. 9. The third embodiment is basically the same as the second embodiment, and therefore, like parts are represented with like reference marks, or like reference marks plus "B" instead of "A" to omit overlapping explanation.

The third embodiment forms bottom openings Ma to 54f in a metal base plate 19B of the flexure 7B under bottom faces of terminals 27Ba to 27Bg.

The bottom openings 54a to 54f are formed by removing (for example, etching off) the metal base plate 19B under the bottom faces of the terminals 27Ba to 27Bg. The metal base plate 19B, therefore, is not present under the bottom faces of the terminals 27Ba to 27Bg. Around the bottom openings 54a to 54f, there are extensions 56a to 56f that face holes 44Ba to 44Bg, respectively, formed in a base insulating layer 21B.

The extension 56a is integral with a main body 58 of the metal base plate 19B. The extensions 56b to 56f are formed like comb teeth from the main body 58 orthogonal to an extending direction of the flexure 7B. The extensions 56a to 56f form exposed parts 32Ba to 32Bg.

The third embodiment provides the same effect as the second embodiment.

In addition, the third embodiment forms the bottom openings 54a to 54f in the metal base plate 19B under the bottom faces of the terminals 27Ba to 27Bg, to reduce parasitic capacitance between the terminals 27Ba to 27Bg and the metal base plate 19B and improve electrical characteristics of a wiring pattern 23 of the flexure 7B.

Although the present invention has been explained in connection with the first to third embodiments, the present invention is not limited to these embodiments and allows various modifications without departing from the scope of the present invention.

For example, the exposed part of any one of the embodiments may be at least one between adjacent terminals so that the single exposed part is shared between the adjacent terminals. Even in this case, the exposed part (hole) is in the vicinity of the respective one of the adjacent terminals (both of the adjacent terminals) so that a distance between the respective one of the adjacent terminals and the exposed part (hole) in the vicinity thereof is set to be shorter than a distance between the adjacent terminals.

The holes 44a to 44f recessed from the openings 30a to 30c according to the first embodiment may be omitted. In this case, the openings 30a to 30c function as the holes and the projections 40a to 40f function as the exposed parts 32a to 32f.

The holes 44a to 44f of the first embodiment may be separated from the openings 30a to 30c.

What is claimed is:

1. A flexure having a metal base plate, an insulating layer formed on the metal base plate, a wiring pattern formed on the insulating layer, a read-write head connected to a first end of the wiring pattern, and at least a pair of terminals for external connection that are adjacent to each other and are connected to a second end of the wiring pattern, the flexure comprising:
a hole formed through the insulating layer in the vicinity of respective one of the adjacent terminals;
an exposed part being a part of the metal base plate that is exposed through the hole to the terminals; and
a distance between the respective one of the adjacent terminals and the exposed part exposed through the hole in the vicinity thereof being shorter than a distance between the adjacent terminals.

2. The flexure of claim 1, wherein the distance between the respective one of the adjacent terminals and the exposed part exposed through the hole in the vicinity thereof is equal to or shorter than 250 micrometers.

3. The flexure of claim 1, wherein the exposed part is present at least between the adjacent terminals.

4. The flexure of claim 1, further comprising:
an opening formed through the metal base plate and insulating layer,
each of the terminals being a flying lead that is formed from the wiring pattern and passes over the opening.

5. The flexure of claim 4, wherein the hole is recessed in a radial direction from an edge of the opening.

6. The flexure of claim 4, wherein the exposed part has a projection that projects into the opening.

7. The flexure of claim 1, wherein each of the terminals is a pad that is formed on the insulating layer so that the insulating layer is continuously present on and around a bottom face of the pad.

8. The flexure of claim 7, wherein the metal base plate is continuously present along the insulating layer.

9. The flexure of claim 7, wherein the metal base plate includes a bottom opening that is formed under the bottom face of each of the terminals and an extension that faces the hole formed through the insulating layer to form the exposed part.

10. A head suspension having the flexure of claim 1, comprising:
a base plate and a load beam supported with the base plate; and
the flexure being supported with the load beam.

* * * * *